United States Patent [19]
Stockmeier et al.

[11] Patent Number: 5,635,757
[45] Date of Patent: Jun. 3, 1997

[54] POWER SEMICONDUCTOR MODULE AND CIRCUIT ARRANGEMENT COMPRISING AT LEAST TWO POWER SEMICONDUCTOR SWITCH MODULES

[75] Inventors: Thomas Stockmeier; Uwe Thiemann, both of Ranchos Palos Verdes, Calif.

[73] Assignee: Asea Brown Boveri AG, Baden, Switzerland

[21] Appl. No.: 390,999

[22] Filed: Feb. 21, 1995

[30] Foreign Application Priority Data

Feb. 21, 1994 [DE] Germany ............ 44 05 443.2

[51] Int. Cl.$^6$ .................................. H01L 23/52
[52] U.S. Cl. ............ 257/691; 257/182; 257/685; 257/714; 257/723
[58] Field of Search .................. 257/691, 723, 257/728, 678, 714, 724, 685, 167, 177, 182

[56] References Cited

U.S. PATENT DOCUMENTS

| | | | |
|---|---|---|---|
| 4,808,861 | 2/1989 | Ehni | 257/368 |
| 4,965,710 | 10/1990 | Pelly et al. | 257/713 |
| 5,444,295 | 8/1995 | Lake et al. | 257/678 |
| 5,498,886 | 3/1996 | Hsu et al. | 257/213 |

FOREIGN PATENT DOCUMENTS

| | | |
|---|---|---|
| 0145256A1 | 6/1985 | European Pat. Off. . |
| 0417747A2 | 3/1991 | European Pat. Off. . |

*Primary Examiner*—Mahshid D. Saadat
*Assistant Examiner*—T. M. Arroyo
*Attorney, Agent, or Firm*—Oblon, Spivak, McClelland, Maier & Neustadt, P.C.

[57] ABSTRACT

A circuit arrangement and a power semiconductor module are provided in which the circuit arrangement comprises a plurality of parallel-connected power semiconductor modules, of which only one is connected to a control device. The other modules function as slaves of the master connected to the control device and draw the signal required for triggering from the master via a signal bus. For this purpose, the power semiconductor modules have a number of signal connections which are interconnected. The signal connections may be connected signalwise to the gate connections, for example via an interface. The power semiconductor modules according to the invention provide a circuit arrangement in which a plurality of modules can be connected in parallel up to maximum performances without limitations.

19 Claims, 1 Drawing Sheet

POWER SEMICONDUCTOR MODULE AND CIRCUIT ARRANGEMENT COMPRISING AT LEAST TWO POWER SEMICONDUCTOR SWITCH MODULES

BACKGROUND OF THE INVENTION

1. Field of the invention

The invention relates to the field of power electronics.

It proceeds from a circuit arrangement or from a power semiconductor module in accordance with the preamble of the corresponding independent claims.

2. Discussion of background

European Patent Application EP-A2-0 417 747 has already described such a circuit arrangement or such a power semiconductor module.

In that case, the circuit arrangement comprises at least two power semiconductor switch modules having a package, two main connections and two gate connections. The power semiconductor modules used are constructed correspondingly.

A module comprises, as a rule, a plurality of semiconductor components which can be combined to form a logic functional unit. Examples are rectifiers, individual switches comprising antiparallel diodes or entire phase assemblies. Such modules (thyristor, transistor, IGBT, diode modules) are nowadays widespread in the power region of 1,200 V and a few 100 A and are primarily used in industrial drives.

In order to obtain a required performance, a plurality of components of one type are, as a rule, connected in parallel in one module. Thus, for example, each IGBT half-bridge module for 150 A, 1,200 V may contain six parallel-connected IGBTs and two parallel-connected antiparallel diodes per switching function.

At present, upper limits are imposed on the performance of modules (in particular in relation to current carrying capacity) since modules cannot be constructed with any size desired. The difficulties lie in the reliability problems, which increase considerably with the overall size, and the parallel connection of a large number of components, which becomes increasingly more difficult.

In addition, with increasing size of the modules, one of their outstanding characteristics is lost, namely the modularity, i.e. the increase in the electrical power not through ever larger components but by connecting ever more similar components in parallel. For these reasons, the unlimited connectability of modules in parallel would be a desirable characteristic.

Unfortunately, limits are imposed on the connectability of modules in parallel. Since, after all, the electrical parameters of the modules are never quite identical, the forward, reverse and switching behavior of the modules may be different. In the case of parallel connection, this may result in oscillations or overloading of individual modules until they are destroyed. The publication mentioned at the outset attempts to counteract this by attempting to reduce the inductance of the commutating circuit by means of a special arrangement of the electrodes.

However, this does not take account of the abovementioned problems, which are due to parameter differences. As a rule, this problem is solved by preselecting the modules to be connected in parallel in relation to critical parameters. As a result, it later becomes virtually impossible in the application to replace a single module in a parallel circuit. A further possibility is that the modules are not exploited up to their specified performance ("derating").

In a new category of modules, the so-called integrated or intelligent modules (integrated power modules, IPM), additional functions, such as triggering of the components to be switched, logic for recognizing faults (e.g. excess temperature, overcurrent, undervoltage of the supply) and electrical isolation of the triggering and fault signals are incorporated in the module.

Added to the problems described above in the case of the parallel connection of such modules, which parallel connection is required for high powers, are those of the triggering, fault detection and fault processing, etc. which do not function precisely simultaneously.

Thus, for example, a slight variation in the voltage supply of the receiver of an optical waveguide used for the potential-free transmission of the triggering signal and incorporated in the module may result in a propagation time delay of a few 100 nsec, which has a considerable adverse effect on the parallel connection of such modules.

SUMMARY OF THE INVENTION

Accordingly, one object of the invention is to provide a novel circuit arrangement and a power semiconductor module in which the abovementioned problems can be avoided in the case of parallel connection. In particular, it is intended that the power semiconductor module can be connected in parallel with other modules without preselection and derating up to the full specified performance.

This object is achieved in a circuit arrangement or a module of the type mentioned at the outset by the features of the corresponding independent claim.

The essence of the invention is therefore that the power semiconductor module has, in addition to the gate connection and the main connections, a number of signal connections which are interconnected when a plurality of modules is connected in parallel. In addition, only a single, freely selectable power semiconductor module is connected to the control device.

If a plurality of modules according to the invention are connected in parallel, this results in a common signal bus which is driven by that module which is connected to the control device. The latter module therefore functions as master, while the others have the function of a slave.

Preferably, the connection between the gate connections and the control device is made in a potential-free manner and, in particular, using optical waveguides. In addition, the modules may be mounted on a heat sink.

In addition, there may be provided between the gate connections and the signal connections an interface which is responsible for the required signal matching. Said interface may be provided either only in the case of the master or in the case of all the parallel-connected modules.

Further exemplary embodiments emerge from the corresponding subclaims.

The advantage of the construction according to the invention is, in particular, that a plurality of modules according to the invention can be connected in parallel without preselection or derating since the master governs the other modules, with the result that the problems mentioned at the outset are eliminated. In addition, only one type of module has to be manufactured and only one potential-free connection has to be provided. This reduces the user's production costs considerably. However, the operating costs can also be reduced effectively since, firstly, the uniform loading, governed by the master, of all the modules increases the service life and, secondly, a defective module can be replaced within the parallel connection without difficulty.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawing, wherein the sole drawing (FIG. 1) shows the parallel connection of four power semiconductor modules according to the invention.

DESCRIPTION OF THE PREFERRED EMBODIMENT

Figure 1:
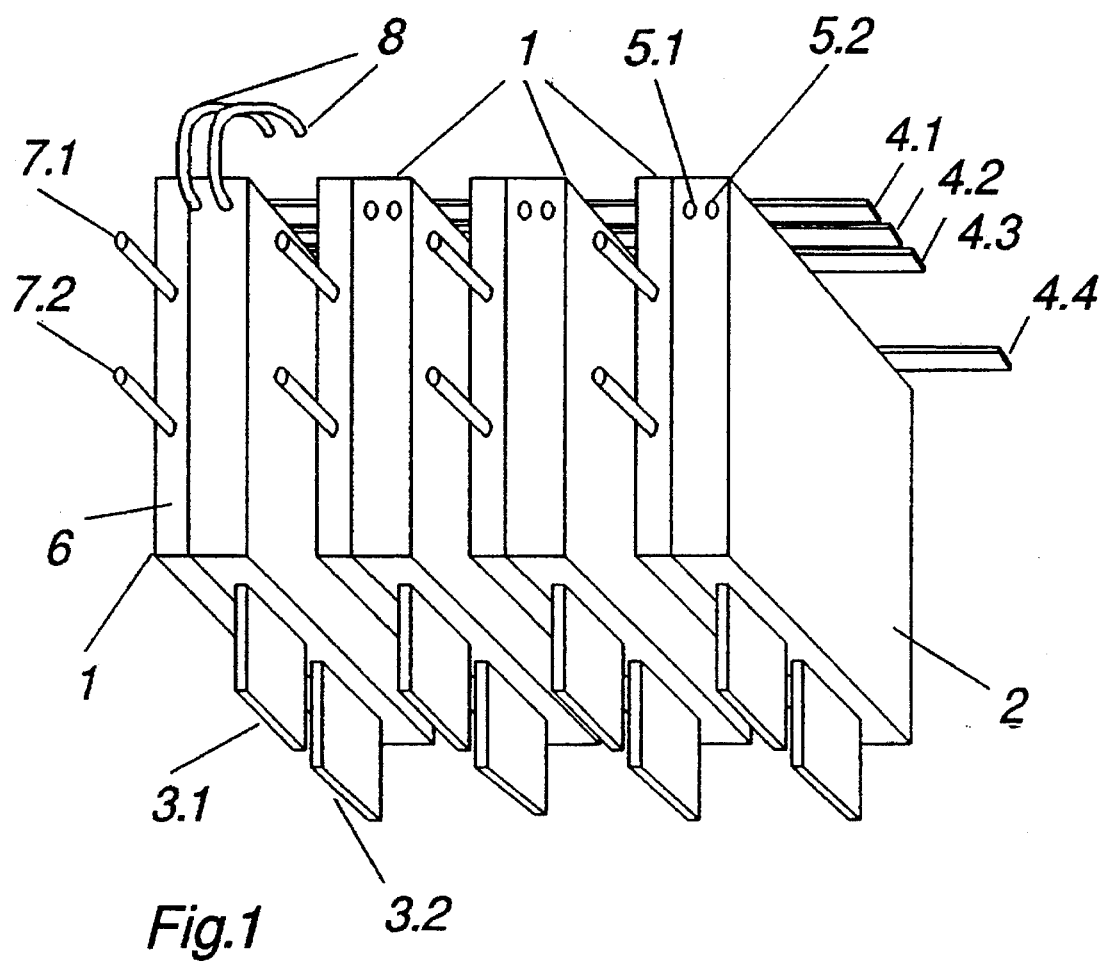

Referring now to the drawing, FIG. 1 shows the structure of a power semiconductor module (1) according to the invention. This may be any power semiconductor module, for example a GTO, thyristor, IGBT or diode module.

The module (1) always comprises a package (2) having, for example, two main connections (3.1, 3.2), at least one gate connection (5.1, 5.2) and a number of signal connections (4.1–4.4). The gate connection comprises, for example, a first connection for signals to be conducted away from the module and a second connection for signals to be conducted to it. It is, in particular, of potential-free design and may be connected, for example, via optical waveguides (8) to a control device, which is not shown. Preferably, the power semiconductor modules (1) are mounted on a heat sink (6) which has, for example, a coolant flowing through it. In this case, coolant connections (7.1, 7.2) are provided on the heat sink (6). According to a preferred constructional variant, the liquid connections (7.1 and 7.2) and the optical waveguide connections (5.1 and 5.2) are disposed on the same side.

According to the invention, the power semiconductor module (1) also has a number (four are shown) of signal connections (4.1–4.4). The signal connections may comprise, for example,

- a first path for triggering the switches,
- a second path for fault signals,
- a third path for clocking the power semiconductor modules, and
- a fourth path via which the gate electrodes of the switches can be connected.

If a plurality of modules (1) according to the invention are connected in parallel, a signal bus consequently results which has, for example, the above signals. Preferably, the signal connections (4.1–4.4) are disposed on a separate side of the package.

In addition, there may be incorporated in the power semiconductor modules (1) an interface which converts the signals coming from the control device and transmitted via the optical waveguides into suitable signals for the signal bus. The signal connections (4.1–4.4) are therefore connected signalwise to the gate connections (5.1, 5.2).

The arrangement becomes particularly inexpensive if only that module (1) which is connected to the control device is provided with an interface.

If a plurality of power semiconductor modules (1) according to the invention is connected in parallel, a circuit arrangement consequently results in which

- only one, freely selectable power semiconductor module (1) is connected to a control device via gate connections (5.1, 5.2),
- a number of signal connections (4.1–4.4) which can be connected signalwise to the gate connections (5.1, 5.2) are interconnected and form a signal bus.

Since only one module is connected to the control device, it functions as a master which the other modules follow. In this way, it is possible to avoid the problems mentioned at the outset and encountered when a plurality of modules is connected in parallel.

In total, the invention provides a power semiconductor module which can be used without difficulty up to maximum powers in an arrangement comprising parallel-connected modules.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A circuit arrangement comprising at least two power semiconductor modules which each comprise:
    a package, at least two main connections, and at least one gate connection for triggering and monitoring the power semiconductor modules, wherein
    only one, freely selectable power semiconductor module is connected to a control device via its gate connection,
    each module comprises a plurality of signal connections, the signal connections of all power semiconductor modules being interconnected and thereby forming a common signal bus driven by said module whose gate connection is connected to the control unit.

2. The circuit arrangement as claimed in claim 1, wherein the gate connection of each module comprises a first connection provided for signals to be conducted to the module and a second connection for signals to be conducted away from the module, which second and first connections are designed, in particular, as optical waveguide connections and are connected via an optical waveguide to the control device.

3. A circuit arrangement as claimed in claim 1, wherein the signal connections comprise, in particular:
    a first path for triggering the switches of the power semiconductor modules;
    a second path for fault signals of the power semiconductor modules;
    a third path for clocking the power semiconductor modules; and
    a fourth path via which all the gate electrodes of the switches of the power semiconductor modules can be connected.

4. The circuit arrangement as claimed in claim 1, wherein an interface is provided in every module between the gate connections and the signal connections.

5. The circuit arrangement as claimed in claim 1, wherein an interface between the gate connections and the signal connections is provided only in the module connected to the control device.

6. The circuit arrangement as claimed in claim 2, wherein the main connections are disposed on a first side, the signal connections on a second side and the optical waveguide connections on a third side of the package.

7. A circuit arrangement as claimed in claim 2, wherein the signal connections comprise, in particular:
    a first path for triggering the switches of the power semiconductor modules;
    a second path for fault signals of the power semiconductor modules;
    a third path for clocking the power semiconductor modules; and
    a fourth path via which all the gate electrodes of the switches of the power semiconductor modules can be connected.

8. The circuit arrangement as claimed in claim 2, wherein an interface is provided in every module between the gate connections and the signal connections.

9. The circuit arrangement as claimed in claim 2, wherein an interface between the gate connections and the signal connections is provided only in the module connected to the control device.

10. The circuit arrangement as claimed in claim 6, wherein
   a) the packages are mounted on a heat sink, a coolant flows through the heat sink, coolant inlets and outlets are provided on the third side of the package.

11. A circuit arrangement as claimed in claim 6, wherein the signal connections comprise, in particular:
   a first path for triggering the switches of the power semiconductor modules;
   a second path for fault signals of the power semiconductor modules;
   a third path for clocking the power semiconductor modules; and
   a fourth path via which all the gate electrodes of the switches of the power semiconductor modules can be connected.

12. The circuit arrangement as claimed in claim 6, wherein an interface is provided in every module between the gate connections and the signal connections.

13. A circuit arrangement as claimed in claim 10, wherein the signal connections comprise, in particular:
   a first path for triggering the switches of the power semiconductor modules;
   a second path for fault signals of the power semiconductor modules;
   a third path for clocking the power semiconductor modules; and
   a fourth path via which all the gate electrodes of the switches of the power semiconductor modules can be connected.

14. The circuit arrangement as claimed in claim 10, wherein an interface is provided in every module between the gate connections and the signal connections.

15. The circuit arrangement as claimed in claim 3, wherein an interface is provided in every module between the gate connections and the signal connections.

16. A power semiconductor module comprising:
   a package, at least two main connections, and at least one gate connection for triggering and monitoring the power semiconductor module wherein
   a plurality of signal connections which are connected signalwise to the gate connection, and wherein
   the main connections are disposed on a first side, the signal connections on a second side and the gate connections on a third side of the package.

17. The power semiconductor module as claimed in claim 16, wherein
   the packages are mounted on a heat sink,
   a coolant flows through the heat sink,
   coolant inlets and outlets are provided on the third side of the package.

18. The power semiconductor module as claimed in claim 17, wherein the signal connections comprise, in particular:
   a first path for triggering the switches of the power semiconductor modules;
   a second path for fault signals of the power semiconductor modules;
   a third path for clocking the power semiconductor modules; and
   a fourth path via which all the gate electrodes of the switches of the power semiconductor modules can be connected.

19. The power semiconductor module as claimed in claim 18, wherein an interface is provided between the gate connections and the signal connections.

* * * * *